United States Patent
Choi et al.

(10) Patent No.: US 12,096,648 B2
(45) Date of Patent: Sep. 17, 2024

(54) METHOD FOR ENCAPSULATING ORGANIC ELECTRONIC ELEMENT

(71) Applicant: LG Chem, Ltd., Seoul (KR)

(72) Inventors: Kook Hyun Choi, Daejeon (KR); Joon Hyung Kim, Daejeon (KR); Yu Jin Woo, Daejeon (KR); Mi Lim Yu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 354 days.

(21) Appl. No.: 16/651,102

(22) PCT Filed: Oct. 1, 2018

(86) PCT No.: PCT/KR2018/011618
§ 371 (c)(1),
(2) Date: Mar. 26, 2020

(87) PCT Pub. No.: WO2019/066605
PCT Pub. Date: Apr. 4, 2019

(65) Prior Publication Data
US 2020/0280022 A1    Sep. 3, 2020

(30) Foreign Application Priority Data
Sep. 29, 2017   (KR) .......................... 10-2017-0127801

(51) Int. Cl.
*H10K 50/844*   (2023.01)
*C09D 11/101*   (2014.01)
(Continued)

(52) U.S. Cl.
CPC .......... *H10K 50/844* (2023.02); *C09D 11/101* (2013.01); *C09D 11/30* (2013.01);
(Continued)

(58) Field of Classification Search
CPC ...... H10K 50/844; H10K 50/84; H10K 71/00; H10K 71/135; H10K 85/111;
(Continued)

(56) References Cited

U.S. PATENT DOCUMENTS

| 5,958,648 A * | 9/1999 | Nishimura ............ G03F 7/0046 430/270.1 |
| 2003/0021867 A1* | 1/2003 | Gunnewig ................ A23L 2/04 426/51 |

(Continued)

FOREIGN PATENT DOCUMENTS

| CN | 1550568 A | 12/2004 |
| EP | 2878611 A1 | 6/2015 |

(Continued)

OTHER PUBLICATIONS

Extended Search Report for Application No. EP18862640, dated Sep. 14, 2020, 8 pages.
(Continued)

*Primary Examiner* — Kyoung Lee
*Assistant Examiner* — Christina A Sylvia
(74) *Attorney, Agent, or Firm* — Lerner David LLP

(57) ABSTRACT

A method for encapsulating an organic electronic element and an organic electronic device is provided. The method for encapsulating the organic electronic element is capable of effectively blocking moisture or oxygen introduced from the outside to an organic electronic device, is excellent in flatness of an encapsulating layer to have excellent endurance reliability, and increases efficiency of an encapsulating process.

14 Claims, 2 Drawing Sheets

(51) Int. Cl.
*C09D 11/30* (2014.01)
*H10K 71/00* (2023.01)
*H10K 85/10* (2023.01)
*H10K 102/00* (2023.01)

(52) U.S. Cl.
CPC ........... H10K 71/00 (2023.02); H10K 85/111 (2023.02); H10K 2102/351 (2023.02)

(58) Field of Classification Search
CPC .......... H10K 2102/351; H01L 51/5237; C09D 11/30; C09D 11/101
See application file for complete search history.

(56) References Cited

U.S. PATENT DOCUMENTS

| | | | |
|---|---|---|---|
| 2003/0113518 A1* | 6/2003 | DeYoung | B41M 5/41 428/195.1 |
| 2003/0234848 A1* | 12/2003 | Ishikawa | B41J 2/2117 347/102 |
| 2005/0005848 A1 | 1/2005 | Yamazaki et al. | |
| 2005/0106323 A1 | 5/2005 | Miura | |
| 2006/0025497 A1* | 2/2006 | Ushirogouchi | C09D 11/101 523/160 |
| 2007/0120469 A1* | 5/2007 | Ha | H01L 27/3246 313/504 |
| 2011/0183575 A1 | 7/2011 | Ryu et al. | |
| 2012/0321816 A1 | 12/2012 | Chopra et al. | |
| 2015/0210905 A1 | 7/2015 | Hoshino et al. | |
| 2015/0255737 A1* | 9/2015 | Moro | C09D 183/14 428/447 |
| 2016/0343988 A1* | 11/2016 | Meyer | H01L 51/0097 |
| 2017/0149016 A1* | 5/2017 | Nam | C08F 222/102 |
| 2017/0157949 A1* | 6/2017 | Madigan | H01L 51/0004 |
| 2020/0378576 A1 | 12/2020 | Chen et al. | |

FOREIGN PATENT DOCUMENTS

| | | |
|---|---|---|
| JP | S6459924 A | 3/1989 |
| JP | H03165869 A | 7/1991 |
| JP | 2003017252 A | 1/2003 |
| JP | 2003136711 A | 5/2003 |
| JP | 2003139934 A | 5/2003 |
| JP | 2003260389 A | 9/2003 |
| JP | 2004064007 A | 2/2004 |
| JP | 2004103496 A | 4/2004 |
| JP | 2004327272 A | 11/2004 |
| JP | 2005131497 A | 5/2005 |
| JP | 2006-239565 A | 9/2006 |
| JP | 2008059945 A | 3/2008 |
| JP | 2008077912 A | 4/2008 |
| JP | 2009254996 A | 11/2009 |
| JP | 2013050672 A | 3/2013 |
| JP | 2013140727 A | 7/2013 |
| JP | 2015220442 A | 12/2015 |
| JP | 2020-517975 A | 6/2020 |
| KR | 20110086362 A | 7/2011 |
| KR | 20150039757 A | 4/2015 |
| KR | 20150123161 A | 11/2015 |
| KR | 20170062856 A | 6/2017 |
| WO | 2011040211 A1 | 4/2011 |
| WO | 2014017524 A1 | 1/2014 |

OTHER PUBLICATIONS

Search report from International Application No. PCT/KR2018/011618, mailed Feb. 20, 2019.

* cited by examiner

[Figure 1]
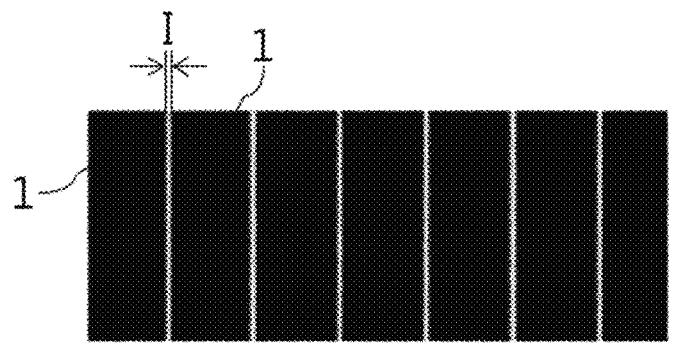
[Figure 2]
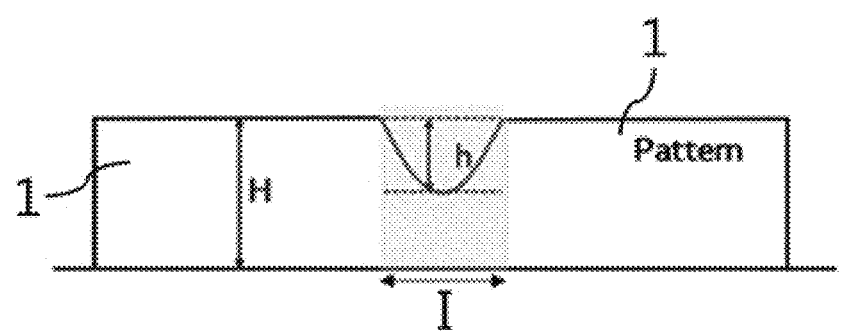
[Figure 3]
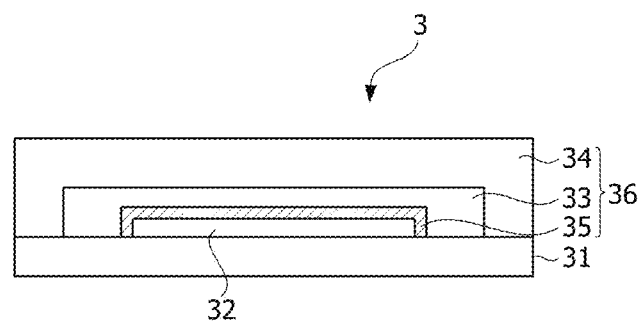

[Figure 4]
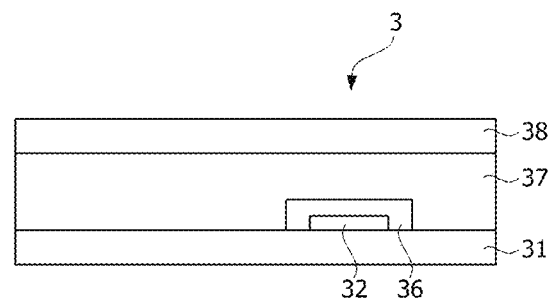

METHOD FOR ENCAPSULATING ORGANIC ELECTRONIC ELEMENT

CROSS-REFERENCE TO RELATED APPLICATIONS

The present application is a national phase entry under 35 U.S.C. § 371 of International Application No PCT/KR2018/011618 filed Oct. 1, 2018 which claims priority from Korean Patent Application No. 10-2017-0127801 filed on Sep. 29, 2017, the disclosure of which is incorporated herein by reference in its entirety.

TECHNICAL FIELD

The present application relates to a method for encapsulating an organic electronic element and an organic electronic device.

BACKGROUND ART

An organic electronic device (OED) means a device comprising an organic material layer that generates an alternating current of electric charges using holes and electrons, an example of which may include a photovoltaic device, a rectifier, a transmitter and an organic light emitting diode (OLED), and the like.

The organic light emitting diode (OLED) of the organic electronic devices has lower power consumption and faster response speed, as compared with the existing light source and is advantageous for thinning display devices or illuminations. In addition, the OLED has excellent spatial availability, thereby being expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application relates to a method for encapsulating an organic electronic element, which provides a method for encapsulating an organic electronic element that is capable of effectively blocking moisture or oxygen introduced from the outside to an organic electronic device, is excellent in flatness of an encapsulating layer to have excellent endurance reliability, and increases efficiency of an encapsulating process.

Technical Solution

The present application relates to a method for encapsulating an organic electronic element. The encapsulation method comprises forming an encapsulating layer on an organic electronic element. The encapsulating layer may have the same meaning as an organic layer to be described below, and may be encapsulated so as to cover the entire surface of the organic electronic element formed on a substrate.

An exemplary encapsulation method may comprise steps of applying an ink composition on a substrate on which an organic electronic element is formed and applying vibration to the applied ink composition. The above-described encapsulating layer may be formed by the ink composition. The vibration may have a vibration intensity of 0.5 to 150 KHz, 0.8 to 145 KHz, 1 to 140 KHz, 7 to 136 KHz, 18 to 128 KHz, 22 to 115 KHz, 28 to 108 KHz or 37 to 100 KHz.

By applying vibration to the ink composition applied on the element, the present application can form an encapsulating layer having excellent flatness without any space between the pattern and the pattern printed by the ink composition. In the case of a general ink-jet process, it is most preferable that the process proceeds without omission (or clogging) of ink nozzles, but in reality, there is a risk that one or more of many nozzles may cause clogging, and such nozzle clogging causes defects in the final print patterns. Accordingly, the present application provides a method capable of realizing excellent reliability even if the nozzle omission or clogging occurs. Also, the present application can prevent line omission stains due to clogging of coating nozzles when applying an ink composition, and can remove microbubbles in the ink composition. In addition, due to such an effect, the present application can prevent dark spots capable of occurring in an organic electronic element, and can prevent display defects due to stains.

In one example, the step of applying vibration can be performed in a range of 0.001 to 300 seconds, 0.005 to 290 seconds, 0.01 to 280 seconds, 1 to 270 seconds, 30 to 260 seconds, 50 to 250 seconds or 150 to 245 seconds. Within the above range, the present application can maintain excellent flatness of the applied ink composition and increase the efficiency by reducing the time and cost of the process.

In an embodiment of the present application, the step of applying an ink composition may proceed in a range of 50 dpi to 1000 dpi. That is, the ink composition of the present application is used as an ink for ink-jet printing so that 50 dot to 1000 dot per inch can be printed. The present application can accurately print an ink composition on a substrate by adjusting the above numerical values.

In one example, the applied ink composition may have a thickness of 2 to 15 μm or 5 to 13 μm. The thickness is a thickness range which can realize excellent flatness of an encapsulating layer in a flattening process while the encapsulating layer formed on the device can sufficiently block moisture. Also, it may be a thickness in which optimum flatness is realized at the above-described vibration intensity and/or vibration time.

Here, the step of applying an ink composition may comprise forming two or more print patterns extending in one direction. The ink composition may form two or more print patterns by ink-jet printing, where the print pattern may comprise a primary print pattern (1) and a secondary print pattern (1), as shown in FIG. 1. FIG. 1 shows an exemplary diagram in which seven print patterns are formed, although not indicated separately in the drawing.

In one example, the print pattern may be formed of two or more ink composition dots, where the pitch of the dots may be in a range of 10 to 250 μm, 12 to 230 μm, 15 to 180 μm, 18 to 140 μm, 22 to 110 μm or 35 μm to 90 μm. That is, the print pattern (1) may be formed by collecting two or more dots, where the pitch between the dot and the dot may be the above range. Also, an interval (I) of 10 to 250 μm, 50 to 230 μm, 80 to 210 μm, 110 to 190 μm or 130 to 185 μm may exist between the print patterns extending in one direction. The interval may be an interval that exists after the applying step and before the step of applying vibration. In the present application, two or more print patterns extending in one direction may be formed due to the characteristics of ink-jet printing, and there may be a dot pitch required in forming the one print pattern. However, in the ink-jet process, there may be one or more intervals depending on an omission phenomenon of the coating nozzles, and thus the present application produces an encapsulating layer having excellent endurance reliability by considering these characteristics comprehensively and adjusting the above-described vibration intensity such that no void space (interval) is generated between the print pattern and the pattern.

In an embodiment of the present application, the encapsulation method may further comprise a step of curing the applied ink composition. The curing step may comprise irradiating the composition with light. In one example, the curing may comprise irradiating the composition with light having any one wavelength in a range of 250 nm to 450 nm, 300 nm to 450 nm, 320 nm to 425 nm, 355 nm to 400 nm or 380 nm to 398 nm at a light quantity of 0.3 to 6 J/cm$^2$ or a light quantity of 0.5 to 6 J/cm$^2$. In curing the ink composition applied on the organic electronic element, the present application can prevent the element from being damaged by light, as the curing proceeds under the above conditions.

In an embodiment of the present application, the encapsulation method may further comprise a step of applying heat to the applied ink composition. The step of applying heat may proceed before and/or after the curing of the applied ink composition. That is, the step of applying heat may proceed before the applied ink composition is cured or may proceed after it is cured, and may proceed two times or more before and after the curing. Furthermore, in one example, the step of applying heat may proceed simultaneously with the step of applying vibration to the applied ink composition or may proceed separately. The present application comprises a step of heating the applied ink composition before or after curing it for encapsulation of an organic electronic element, whereby it can minimize the out-gas generated from the ink composition while improving the flatness of the encapsulating layer formed on the organic electronic device. By minimizing the out-gas, the present application can prevent the physical and chemical damage of the organic electronic element resulting from the ink composition applied directly on the element.

The step of applying heat may be performed in a range of 20° C. to 230° C., 23° C. to 200° C. or 24° C. to 164° C. Furthermore, the step of applying heat may proceed for any one time of 1 minute to 40 minutes or 3 minutes to 29 minutes. By adjusting the temperature or the time, the present application can reduce the out-gas amount while realizing excellent flatness when the ink composition applied on the element forms an encapsulating layer, and can prevent the element from being damaged by the heating step.

In an embodiment of the present application, the step of applying heat may proceed once only before curing of the ink composition, or may proceed twice or more before and after curing. In the former case, the step of applying heat may proceed in a range of 80° C. to 150° C., 88° C. to 142° C., 92° C. to 137° C. or 96° C. to 123° C. for any one time of 1 minute to 40 minutes or 2 minutes to 35 minutes. In the latter case, the step of applying heat may proceed in a range of 20° C. to 110° C., 22° C. to 98° C., 23° C. to 68° C., 24° C. to 58° C. or 28° C. to 37° C. for any one time of 1 minute to 40 minutes, 2 minutes to 35 minutes or 6 minutes to 15 minutes. In one example, if the heating temperature before curing is somewhat high, partial curing of the ink composition proceeds or side reactions occur, whereby it may be difficult to form an encapsulating layer of desired physical properties. After the above step, the curing of the ink composition may proceed, where after the curing step, it may proceed in a range of 50° C. to 230° C., 55° C. to 180° C., 58° C. to 178° C., 60° C. to 172° C., 62° C. to 167° C. or 75° C. to 156° C. for any one time of 1 minute to 40 minutes, 2 minutes to 35 minutes or 2 minutes to 20 minutes. In one example, the ratio (T2/T1) of the temperature (T2) for applying heat after curing to the temperature (T1) for applying heat before curing may be 1.15 to 8, 1.3 to 7.8, 1.8 to 7.2, 2.1 to 6.8, 2.8 to 6.3 or 3.6 to 5.8. By controlling the heating temperature and/or time according to the timing of applying heat as above, the present application can reduce the out-gas amount while realizing excellent flatness when the ink composition applied on the element forms an encapsulating layer, prevent the element from being damaged by the heating step and prevent some curing or side reactions of the applied composition.

In one example, the encapsulation method in the present application may comprise forming a reflective electrode or a transparent electrode on a substrate such as, for example, a glass or polymer film as a substrate by a method such as vacuum evaporation or sputtering and forming an organic material layer on the reflective electrode to form an organic electronic element, before the above-described application step and vibration step. The organic material layer may comprise a hole injecting layer, a hole transporting layer, a light emitting layer, an electron injecting layer and/or an electron transporting layer. Subsequently, a second electrode is further formed on the organic material layer. The second electrode may be a transparent electrode or a reflective electrode.

The preparation method of the present application may further comprise a step of forming an inorganic layer on the first electrode, the organic material layer and the second electrode formed on the substrate. Thereafter, as described above, an encapsulating layer (organic layer) is formed by applying an ink composition on the substrate so as to cover the entire surface of the organic electronic element. At this time, the step of forming an organic layer is not particularly limited, and the ink composition may be applied to the top of the substrate using a process of ink-jet printing gravure coating, spin coating, screen printing or reverse offset coating, and the like.

In an embodiment of the present application, the step of applying an ink composition may comprise ejecting an ink composition using an ink-jet apparatus. As described above, the ink-jet process can be applied to sealing or encapsulating organic electronic devices such as, for example, OLEDs.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

In an embodiment of the present application, the ink composition may be a solventless type. Furthermore, the ink composition may be a photocurable composition. By using the ink composition, the present application minimizes the content of volatile organic compounds or ionic substances contained by using an organic solvent to minimize the out-gas amount in the encapsulating process, whereby the reliability of the organic electronic device can be ensured.

In the present application, the material of the ink composition to be applied to the encapsulation method is not particularly limited, but considering flatness characteristics, outgas characteristics, ink spreadability and print pattern reliability of the present application, it may have a specific composition to be described below, where the specific composition may form an encapsulating layer having excellent endurance reliability by the above-described encapsulation method.

An exemplary ink composition may comprise an epoxy compound and a compound having an oxetane group. The epoxy compound may be a photo-curable or thermosetting compound. The compound having an oxetane group may be contained in a range of 45 parts by weight to 145 parts by weight, 48 parts by weight to 143 parts by weight or 63 parts by weight to 132 parts by weight relative to 100 parts by weight of the epoxy compound. By controlling the specific composition and the content range thereof, the present application can form an organic layer on an organic electronic element by an ink-jet method, makes it possible for the applied ink composition to have excellent spreadability in a short time, and can provide an organic layer having excellent curing sensitivity after curing. Furthermore, the ink composition may comprise a photoinitiator. The ink composition can realize excellent adhesive strength and curing sensitivity as well as processability as an ink composition together with the epoxy compound and the oxetane group-containing compound as described above.

In one example, the epoxy compound may have at least bifunctionality or more. That is, two or more epoxy functional groups may be present in the compound. The epoxy compound realizes excellent heat resistance at high temperature and high humidity by realizing an appropriate degree of crosslinking in a sealing material.

In an embodiment of the present application, the epoxy compound may comprise a compound having a cyclic structure in its molecular structure and/or a linear or branched aliphatic compound. That is, the ink composition of the present application may comprise at least one of a compound having a cyclic structure in its molecular structure and a linear or branched aliphatic compound as an epoxy compound, and may comprise them together. In one example, the compound having a cyclic structure in its molecular structure may have ring constituent atoms in the molecular structure in a range of 3 to 10, 4 to 8, or 5 to 7, and the cyclic structures in the compound may be present in a number of 2 or more and 10 or less. When the compound having a cyclic structure and the linear or branched aliphatic compound are included together, the linear or branched aliphatic compound may be included in the ink composition in a range of 20 parts by weight or more, less than 205 parts by weight, 23 parts by weight to 204 parts by weight, 30 parts by weight to 203 parts by weight, 34 parts by weight to 202 parts by weight, 40 parts by weight to 201 part by weight, 60 parts by weight to 200 parts by weight or 100 parts by weight to 173 parts by weight, relative to 100 parts by weight of the compound having a cyclic structure. By controlling the content range, the present application makes it possible for the ink composition to have suitable physical properties in sealing the entire surface of an organic electronic element, to have excellent curing strength after curing and also to realize excellent moisture barrier properties together.

In one example, the linear or branched aliphatic compound may have an epoxy equivalent in a range of 120 g/eq to 375 g/eq or 120 g/eq to 250 g/eq. By controlling the epoxy equivalent of the aliphatic compound in the above range, the present application can prevent the viscosity of the composition from becoming too high to render the ink-jet process impossible while improving the degree of curing completion after curing of the sealing material.

In one example, the epoxy compound may have an epoxy equivalent in a range of 50 to 350 g/eq, 73 to 332 g/eq, 94 to 318 g/eq, or 123 to 298 g/eq. Also, the compound having an oxetane group or the epoxy compound may have a weight average molecular weight in a range of 150 to 1,000 g/mol, 173 to 980 g/mol, 188 to 860 g/mol, 210 to 823 g/mol, 330 to 780 g/mol or 350 to 500 g/mol. By controlling the epoxy equivalent of the epoxy compound to be low or controlling the weight average molecular weight of the compound having an oxetane group to be low, the present application can realize an excellent printing property when applied to ink-jet printing and simultaneously provide moisture barrier properties and excellent curing sensitivity. In this specification, the weight average molecular weight may mean a value converted to standard polystyrene measured by GPC (gel permeation chromatograph). In this specification, the epoxy equivalent is also grams (g/eq) of the resin containing one gram equivalent of an epoxy group, which may be measured according to the method defined in JIS K 7236.

The compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an ink-jet process, and prevent damage applied to the element due to suppressed outgas. In this specification, the boiling point may be measured at 1 atm, unless otherwise specified.

In one example, the compound having a cyclic structure in its molecular structure may be exemplified by a alicyclic epoxy compound. For example, the compound may be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In one example, as long as the compound comprising an oxetane group has the oxetane functional group, the structure is not limited, and for example, OXT-221, CHOX, OX-SC, OXT101, OXT121, OXT221 or OXT212 from TOAGOSEI, or EHO, OXBP, OXTP or OXMA from ETERNACOLL may be exemplified. Also, the linear or branched aliphatic epoxy compound may include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the ink composition may further comprise a photoinitiator. The photoinitiator may be a cationic photopolymerization initiator. In addition, the photoinitiator may be a compound that absorbs a wavelength in a range of 200 nm to 400 nm.

As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl)

borate. Furthermore, as the cationic photopolymerization initiator, an ionized cationic initiator of onium salt or organometallic salt series or a non-ionized cationic photopolymerization initiator of organic silane or latent sulfonic acid series can be used. A diaryliodonium salt, a triarylsulfonium salt or an aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the encapsulating composition of the present application may comprise a photoinitiator comprising an iodonium salt or a sulfonium salt as a photoinitiator in the above-mentioned specific composition, so as to be suitable for use in sealing an organic electronic element by an ink-jet method. Although the encapsulating composition according to the above composition is directly sealed on the organic electronic element, it is possible to prevent chemical damage from being applied to the element due to a small amount of generated outgas. Furthermore, the photoinitiator also has excellent solubility, which can be suitably applied to an ink-jet process.

In an embodiment of the present application, the photoinitiator may be included in an amount of 1 to 15 parts by weight, 2 to 13 parts by weight, or 3 to 11 parts by weight relative to 100 parts by weight of the epoxy compound.

In an embodiment of the present application, the ink composition may further comprise a surfactant. The ink composition contains a surfactant, so that it can be provided as a liquid ink having enhanced spreadability. In one example, the surfactant may comprise a polar functional group. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the above-described epoxy compound and compound having an oxetane group to provide excellent coating properties on the organic electronic element. On the other hand, in the case of a surfactant containing a polar reactive group, since it has high affinity with the other components of the ink composition, it can participate in the curing reaction, thereby realizing an excellent effect in terms of adhesion. In an embodiment of the present application, a hydrophilic fluorine-based surfactant or non-silicone-based surfactant may be used to improve coating properties of a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or SurfIon 5-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be included in an amount of 0.1 to 10 parts by weight, 0.05 to 10 parts by weight, 0.1 to 10 parts by weight, 0.5 to 8 parts by weight or 1 to 4 parts by weight relative to 100 parts by weight of the epoxy compound. Within the above content range, the present application allows the ink composition to be applied to an ink-jet method, thereby forming a thin film organic layer.

In an embodiment of the present application, the ink composition may further comprise a photosensitizer in order to complement the curing property at a long wavelength activation energy beam of 300 nm or more. The photosensitizer may be a compound that absorbs a wavelength in a range of 200 nm to 400 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-propenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H,11H—Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer may be contained in an amount of 28 to 40 parts by weight, 31 to 38 parts by weight or 32 to 36 parts by weight relative to 100 parts by weight of the photoinitiator to be described below. By controlling the content of the photosensitizer, the present application can prevent the photosensitizer from not dissolving to lower attachment force while realizing a synergistic effect of curing sensitivity at a desired wavelength.

The ink composition of the present application may further comprise a coupling agent. The present application can improve adhesiveness of a cured product of the ink composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent may be included in an amount of 0.1 to 10 parts by weight or 0.5 to 5 parts by weight, relative to 100 parts by weight of the epoxy compound. Within the above range, the present application can realize an effect of improving the adhesiveness by the addition of the coupling agent.

The ink composition of the present application may comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which may include, for example, one or a mixture of two or more of a metal oxide, a metal salt or phosphorus pentoxide ($P_2O_5$), and the like, in the case of a moisture-reactive adsorbent, and may include zeolite, zirconia or montmorillonite, and the like, in the case of the physical adsorbent.

The ink composition of the present application may comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the epoxy compound. As the ink composition of the present application preferably controls the content of the moisture adsorbent to 5 parts by weight or more, the present application can make the ink composition or the cured product thereof exhibit excellent moisture and humidity barrier properties. In addition, by controlling the content of the moisture adsorbent to 100 parts by weight or less, the present application can provide a thin layer encapsulating structure.

In one example, the ink composition may further comprise an inorganic filler, if necessary. The specific type of the usable filler in the present application is not particularly limited, and for example, one or a mixture of two or more of clay, talc, alumina, calcium carbonate, silica, and the like may be used.

The ink composition of the present application may comprise 0 to 50 parts by weight, 1 to 40 parts by weight, 1 to 20 parts by weight, or 1 to 10 parts by weight of inorganic filler, relative to 100 parts by weight of the epoxy compound. The present application can provide an encapsulating structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin layer.

In addition to the above-mentioned constitutions, the ink composition according to the present application may comprise various additives in the range without affecting the above-described effects of invention. For example, the ink composition may comprise a defoamer, a tackifier, an ultraviolet stabilizer or an antioxidant and the like in an appropriate range of content depending on the desired physical properties.

In one example, the ink composition may be in a liquid phase at room temperature, for example, at 15° C. to 35° C. or about 25° C. In an embodiment of the present application, the ink composition may be in a solventless type liquid phase. The ink composition may be applied to seal an organic electronic element, and specifically, the ink composition may be an ink composition that can be applied to seal the entire surface of an organic electronic element. As the ink composition has a liquid form at room temperature, the present application can seal an organic electronic element by applying the composition on the side of the element with the ink-jet method.

Also, in an embodiment of the present application, the ink composition may have a viscosity, as measured by DV-3 from Brookfield, Inc. at a temperature of 25° C., 90% torque and a shear rate of 100 rpm, in a range of 50 cPs or less, 1 to 46 cPs, 3 to 44 cPs, 4 to 38 cPs, 5 to 33 cPs or 14 to 24 cPs. By controlling the viscosity of the composition in the above range, the present application can provide a sealing material of a thin layer by improving the coating property at the time of application to the organic electronic element.

Also, in an embodiment of the present application, the ink composition may have light transmittance of 90% or more, 92% or more, or 95% or more in the visible light region after curing. Within the above range, the present application provides an organic electronic device having high-resolution, low power consumption and long-life by applying the ink composition to a top emission type organic electronic device. Considering the above optical characteristics, the ink composition may not comprise the above-described moisture adsorbent or inorganic filler.

In one example, the ink composition of the present application may have a contact angle to glass of 30° or less, 25° or less, 20° or less, or 12° or less. The lower limit is not particularly limited, but may be 1° or 3° or more. By adjusting the contact angle to 30° or less, the present application can ensure spreadability in a short time in the ink-jet coating, thereby forming an organic layer of a thin film. In the present application, the contact angle may be measured by applying a drop of the encapsulating composition onto glass using a sessile drop measurement method, which may be an average value measured after applying 5 times.

The present application also relates to an organic electronic device. An exemplary organic electronic device (3) may comprise, as shown in FIG. 3, a substrate (31); an organic electronic element (32) formed on the substrate (31); and an organic layer (33) that seals the entire surface of the organic electronic element (32). The organic electronic device may be produced by the above-described encapsulation method, but is not limited thereto.

FIG. 2 is an enlarged cross-sectional diagram of FIG. 1. In an embodiment of the present application, as shown in FIG. 2, in a state where the ink composition is cured in the form of an organic layer including a primary pattern (1) extending in a first direction and a secondary pattern (1) extending in a second direction and formed adjacent to the primary pattern on a substrate on which an organic electronic element is formed, the organic electronic device may have a ratio h/H×100 of the height h of the groove portion between the primary pattern and the secondary pattern to the organic layer thickness H of less than 30%, less than 29%, or 28% or less. The lower limit of the ratio is not particularly limited, which may be 0%, 1% or 5%. In this specification, the fact of being formed adjacent may mean that in the primary pattern extending in one direction, it is positioned to be in contact with a direction perpendicular to the direction extending in one direction. Thus, one direction of the primary pattern and the secondary pattern may be the same direction. By controlling the above ratio, the present application can realize the excellent flatness of the encapsulating layer formed of the ink composition, and such an encapsulating layer can also realize excellent attachment force with an inorganic layer to be attached to the upper part, which is described below.

In the primary and secondary patterns, the ink composition is printed by one droplet, so that two or more dots may form a line, and more specifically, the ink composition dots printed by one droplet may spread to form a pattern in the form of a rectangle extending in one straight line or one direction, where the shape of the pattern is not particularly limited. In the present application, the primary and secondary patterns may be formed simultaneously or may each be formed separately. In this specification, the primary pattern and the secondary pattern are names designated arbitrarily in order to distinguish the pattern from the pattern, which do not mean the order or the number of patterns.

In one example, the interval between the forming point of the primary pattern and the forming point of the secondary pattern may be in a range of 10 μm to 500 μm, 20 μm to 430 μm, 30 μm to 390 μm or 60 μm to 250 μm. Here, the forming point of the print pattern may mean a point where the ink composition dots are applied in the ink-jet printing. The forming point may mean the center of the primary print pattern and the center of the secondary print pattern in consideration of the fact that a number of dots spread to form a print pattern extending in one direction, where the center may mean the center in the direction perpendicular to the direction extending in one direction. In this specification, the term "center" may mean a substantial center, which may have an error of ±10 μm, ±5 μm or ±1 μm. Furthermore, the term "perpendicular" may mean substantially perpendicular, which may also have an error of ±10°, ±5° or ±1°.

In an embodiment of the present application, the organic electronic element may comprise a first electrode layer, an organic layer formed on the first electrode layer and containing at least a light emitting layer, and a second electrode layer formed on the organic layer. The first electrode layer may be a transparent electrode layer or a reflective electrode layer, and the second electrode layer may also be a transparent electrode layer or a reflective electrode layer. More specifically, the organic electronic element may comprise a reflective electrode layer formed on a substrate, an organic layer formed on the reflective electrode layer and containing at least a light emitting layer, and a transparent electrode layer formed on the organic layer.

In the present application, the organic electronic element may be an organic light emitting diode.

In one example, the organic electronic device according to the present application may be a top emission type, but is not limited thereto, and may be applied to a bottom emission type.

The organic electronic device may further comprise an inorganic layer for protecting the electrodes and the light emitting layer of the organic electronic element. The inorganic layer may be an inorganic protective layer. The inorganic layer (35) may be present between the organic electronic element (32) and the above-described organic layer (33). The inorganic layer may be a protective layer by chemical vapor deposition (CVD), where as the material, a known inorganic material may be used.

In an embodiment of the present application, the organic electronic device may further comprise an inorganic layer (34) formed on the organic layer (33). In one example, the inorganic layer may be one or more metal oxides, nitrides or oxynitrides selected from the group consisting of Al, Zr, Ti, Hf, Ta, In, Sn, Zn and Si. The inorganic layer may have a thickness of 0.01 μm to 50 μm, 0.1 μm to 20 μm, or 1 μm to 10 μm. In one example, the inorganic layer of the present application may be an inorganic material without any dopant, or may be an inorganic material containing a dopant. The dopant which may be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the thickness of the organic layer may be in a range of 2 μm to 20 μm, 2.5 μm to 15 μm, and 2.8 μm to 9 μm. The present application can provide a thin film organic electronic device by providing an organic layer having a thin thickness.

The organic electronic device of the present application may comprise an encapsulating structure (36) containing the organic layer (33) and the inorganic layer (34, 35), as described above, where the encapsulating structure may comprise at least one or more organic layers and at least one or more inorganic layers, and the organic layer and the inorganic layer may be repeatedly laminated. For example, the organic electronic device may have a structure of substrate/organic electronic element/inorganic layer/(organic layer/inorganic layer)n, where n may be a number in a range of 1 to 100.

In one example, the organic electronic device of the present application may further comprise a cover substrate present on the organic layer. The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Also, as shown in FIG. 4, the organic electronic device (3) may further comprise an encapsulating film (37) existing between the cover substrate (38) and the substrate (31) on which the organic electronic element (32) is formed. The encapsulating film (37) may be applied as a use for attaching the substrate (31) on which the organic electronic element (32) is formed and the cover substrate (38), which may be, for example, a pressure-sensitive adhesive film or an adhesive film in a solid phase at room temperature, but is not limited thereto. The encapsulating film (37) may seal the top side of the encapsulating structure (36) of the above-described organic layer and inorganic layer, laminated on the organic electronic element (32).

Advantageous Effects

The present application relates to a method for encapsulating an organic electronic element using an ink composition, and provides a method for encapsulating an organic electronic element, which is capable of effectively blocking moisture or oxygen introduced from the outside into the organic electronic element, is excellent in flatness of the encapsulating layer formed of the ink composition to have excellent endurance reliability, prevents line omission stains due to clogging of coating nozzles when applying the ink composition, and is capable of removing microbubbles in the ink composition, thereby increasing efficiency of an encapsulating process.

BRIEF DESCRIPTION OF DRAWINGS

FIG. 1 is a plan diagram showing a print pattern according to one example of the present invention.

FIG. 2 is a cross-sectional diagram showing a print pattern according to one example of the present invention.

FIGS. 3 and 4 are cross-sectional diagrams showing an organic electronic device according to one example of the present invention.

EXPLANATION OF REFERENCE NUMERALS AND SYMBOLS

1: print pattern
I: interval
H: organic layer thickness
h: height of groove portion
3: organic electronic device
31: substrate
32: organic electronic element
33: organic layer
34: inorganic layer
35: inorganic layer (inorganic protective layer)
36: encapsulating structure
37: encapsulating film
38: cover substrate Best Mode Hereinafter, the present invention will be described in more detail through Examples according to the present invention and Comparative Examples not complying with the present invention, but the scope of the present invention is not limited by the following examples.

Preparation of Ink Composition

An alicyclic epoxy compound (Celloxide 2021P, Daicel Corp.) and an aliphatic epoxy compound (DE200, HAJIN CHEM TECH) as epoxy compounds, an oxetane group-containing compound (OXT-221 from TOAGOSEI), a photoinitiator comprising an iodonium salt (TTA-UV694 from Tetrachem, hereinafter, UV694) and a fluorine-based surfactant (F552 from DIC) were introduced into a mixing vessel in a weight ratio of 23.8:28.7:41.5:5.0:1.0 (Celloxide 2021P: DE200: OXT-221: UV694: F552), respectively, at room temperature.

In the mixing vessel, a uniform ink composition ink was prepared using a planetary mixer (Kurabo, KK-250s).

Example 1

The prepared ink composition was subjected to ink-jetting on a substrate, on which an organic electronic element was formed, using Unijet UJ-200 (Inkjet head-Dimatix 10Pl 256) to form print patterns. An average pitch of the ink composition dots was set to 40 μm to form the print patterns, and an average interval between the print patterns was set to 180 μm to form the organic layer patterns. Using a vibrating device, the vibration was applied to the print patterns applied on the substrate at an intensity of 40 KHz for 0.01 seconds.

The applied print patterns were subjected to heat treatment at 100° C. for 3 minutes. The ink composition was irradiated with UV of 1 J/cm$^2$ at an intensity of 1000 mW/cm$^2$ under a 5% relative humidity condition and cured to produce an organic electronic device.

Example 2

An organic electronic device was prepared in the same manner as in Example 1, except that the vibration was applied to the applied print patterns for 10 seconds.

Example 3

An organic electronic device was prepared in the same manner as in Example 1, except that the vibration was applied to the applied print patterns for 40 seconds.

Example 4

An organic electronic device was prepared in the same manner as in Example 1, except that the vibration was applied to the applied print patterns for 240 seconds.

Example 5

An organic electronic device was prepared in the same manner as in Example 1, except that the vibration intensity was changed to 100 KHz.

Example 6

An organic electronic device was prepared in the same manner as in Example 2, except that the vibration intensity was changed to 100 KHz.

Example 7

An organic electronic device was prepared in the same manner as in Example 3, except that the vibration intensity was changed to 100 KHz.

Example 8

An organic electronic device was prepared in the same manner as in Example 4 except that the vibration intensity was changed to 100 KHz.

Example 9

An alicyclic epoxy compound (Celloxide 2021P, Daicel Corp.) and an aliphatic epoxy compound (DE200, HAJIN CHEM TECH) as epoxy compounds, an oxetane group-containing compound (OXT-221 from TOAGOSEI), a photoinitiator comprising an iodonium salt (TTA-UV694 from Tetrachem, hereinafter, UV694) and a fluorine-based surfactant (F552 from DIC) were introduced into a mixing vessel in a weight ratio of 43.8:28.7:17.5:5.0:1.0 (Celloxide 2021P: DE200: OXT-221: UV694: F552), respectively, at room temperature.

In the mixing vessel, a uniform ink composition ink was prepared using a planetary mixer (Kurabo, KK-250s).

Through the ink thus prepared, the ink-jetting was performed in the same manner as in Example 4 to encapsulate an organic electronic element, and an organic electronic device was produced.

Example 10

An alicyclic epoxy compound (Celloxide 2021P, Daicel Corp.) and an aliphatic epoxy compound (DE200, HAJIN CHEM TECH) as epoxy compounds, an oxetane group-containing compound (OXT-221 from TOAGOSEI), a photoinitiator comprising an iodonium salt (TTA-UV694 from Tetrachem, hereinafter, UV694) and a silicone surfactant (BYK-3455) were introduced into a mixing vessel in a weight ratio of 23.8:28.7:41.5:5.0:1.0 (Celloxide 2021P: DE200: OXT-221: UV694: BYK-3455), respectively, at room temperature.

In the mixing vessel, a uniform ink composition ink was prepared using a planetary mixer (Kurabo, KK-250s).

Through the ink thus prepared, the ink-jetting was performed in the same manner as in Example 4 to encapsulate an organic electronic element, and an organic electronic device was produced.

Comparative Example 1

An organic electronic device was prepared in the same manner as in Example 1, except that the print patterns were formed without applying vibration and then UV was irradiated after a waiting time of 0.01 seconds.

Comparative Example 2

An organic electronic device was prepared in the same manner as in Example 1, except that the print patterns were formed without applying vibration and then UV was irradiated after a waiting time of 10 seconds.

Comparative Example 3

An organic electronic device was prepared in the same manner as in Example 1, except that the print patterns were formed without applying vibration and then UV was irradiated after a waiting time of 40 seconds.

Comparative Example 4

An organic electronic device was prepared in the same manner as in Example 1, except that the print patterns were formed without applying vibration and then UV was irradiated after a waiting time of 240 seconds.

The physical properties in Examples and Comparative Examples were evaluated in the following manner.

1. Flatness Measurement

For the cured organic layers prepared in Examples and Comparative Examples, the ratio h/H×100 of the height h of the groove portion between the primary pattern and the secondary pattern to the thickness H of the organic layer was measured and calculated, as shown in FIG. 2. The thickness of the organic layer was measured as the average thickness. In the measurement, the thickness H and the height h of the groove portion were measured using an Alpha step (KLA-Tencor).

TABLE 1

|  | Flatness (h/H × 100, %) |
|---|---|
| Example 1 | 26 |
| Example 2 | 25 |
| Example 3 | 21 |
| Example 4 | 9 |
| Example 5 | 8 |
| Example 6 | 7 |
| Example 7 | 5 |
| Example 8 | 1 |
| Example 9 | 29 |
| Example 10 | 29.5 |
| Comparative Example 1 | 40 |
| Comparative Example 2 | 35 |
| Comparative Example 3 | 32 |
| Comparative Example 4 | 30 |

The invention claimed is:

1. A method for encapsulating an organic electronic element, comprising:
    applying an ink composition on a substrate, wherein the ink composition is applied as two or more printed patterns extending in a same direction, wherein an interval exists between each of the printed patterns, where the interval is a hollow space where no ink has been applied, wherein an organic electronic element is applied on the substrate and has the ink composition applied thereon;
    applying vibration to the applied ink composition at an intensity of 0.5 KHz to 150 KHz for 0.001 seconds to 300 seconds, wherein the applied vibration causes ink from the printed patterns to apply in the interval; and
    then curing the applied ink composition to form an encapsulating layer which encapsulates the organic electronic element.

2. The method according to claim 1, wherein the applying of the ink composition proceeds in a range of 50 dpi to 1000 dpi.

3. The method according to claim 1, wherein the deposited ink composition has a thickness of 2 μm to 15 μm.

4. The method according to claim 1, wherein the print patterns are formed of two or more ink composition dots and a pitch of the ink composition dots is in a range of 10 μm to 250 μm.

5. The method according to claim 1, wherein the interval has a width of 10 μm to 250 μm.

6. The method according to claim 1, wherein the curing of the applied ink composition comprises:
irradiating the applied ink composition with light.

7. The method according to claim 1, further comprising:
applying heat to the applied ink composition.

8. The method according to claim 7, wherein the applying of the heat proceeds before and/or after the curing of the applied ink composition.

9. The method according to claim 7, wherein the applying of the heat proceeds in a range of 20° C. to 230° C.

10. The method according to claim 7, wherein the applying of the heat proceeds in a range of 1 minute to 40 minutes.

11. The method according to claim 1, wherein the ink composition is a solventless type photocurable composition.

12. The method according to claim 1, wherein the ink composition comprises an epoxy compound and a compound having an oxetane group in an amount of 45 parts by weight to 145 parts by weight relative to 100 parts by weight of the epoxy compound.

13. The method according to claim 1, wherein the ink composition comprises a fluorine-based surfactant.

14. An organic electronic device which is encapsulated according to the method of claim 1, wherein the device comprises:

the substrate;

the organic electronic element disposed on the substrate; and the encapsulating layer which encapsulates the organic electronic element, wherein the encapsulating layer includes at least two patterned portions and a grooved portion therebetween, wherein the at least two patterned portions have a height H and the grooved portion has a height h, and wherein a ratio h/H×100 is from 1% to less than 30%.

* * * * *